April 8, 1969 J. D. HELMS 3,436,821

METHOD OF MANUFACTURING CONDUCTIVE PINS AND PELLETS

Filed June 18, 1965 Sheet 1 of 2

John D. Helms,
Inventor.

Koenig, Senniger, Powers and Leavitt,
Attorneys.

John D. Helms,
Inventor.
Koenig, Senniger, Powers and Leavitt,
Attorneys.

United States Patent Office 3,436,821

Patented Apr. 8, 1969

3,436,821

METHOD OF MANUFACTURING CONDUCTIVE PINS AND PELLETS

John D. Helms, Dallas, Tex., assignor to Texas Instruments Incorporated, Dallas, Tex., a corporation of Delaware Filed June 18, 1965, Ser. No. 465,004
Int. Cl. H01r 9/00, 43/00
U.S. Cl. 29—630 7 Claims

ABSTRACT OF THE DISCLOSURE

This invention relates to electrically conductive pins, pellets and the like, and also to their manufacture and use; and with regard to certain more specific features, to such articles for use in connection with miniaturized electrical circuitry such as may be carried on modular circuit boards.

Among the several objects of the invention may be noted the provision of conductive pins, pellets or the like of the class described having improved end portions for welding, brazing, soldering or the like; the provision of improved low-cost means for the manufacturing and high-speed handling and application of pins or pellets of the class described; and the provision of improved means for applying pins to make up electronic circuit board interconnections, for using pellets for controlling certain difficult soldering, welding or brazing operations. Other objects and features will be in part apparent and in part pointed out hereinafter.

The invention accordingly comprises the methods, elements and combinations of elements, steps and sequence of steps, features of construction, manipulation, products and arrangements of their parts, which will be exemplified hereinafter, and the scope of which will be indicated in the following claims.

In the accompanying drawings, in which several of various possible embodiments of the invention are illustrated:

Figure 9:
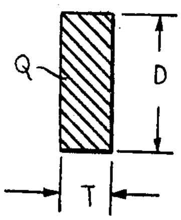
Figure 10:
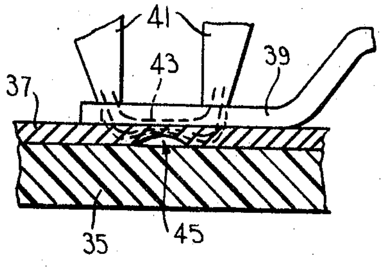
Figure 11:
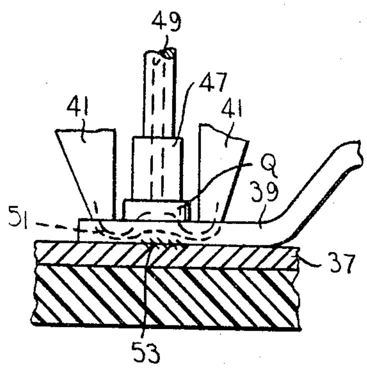
Figure 12:
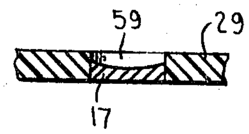
Figure 13:
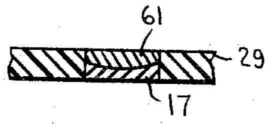

FIG. 9 on an enlarged scale illustrates a shorter pellet form of product;

FIG. 10 illustrates a former welding process;

FIG. 11 is a view similar to FIG. 10, illustrating advantages obtained in welding by use of a pellet such as shown on FIG. 9;

FIG. 12 is a detail section illustrating a modified step for making an alternative form of pellet for soldering;

FIG. 13 is a view similar to FIG. 12, illustrating a succeeding step; and

Figure 14:
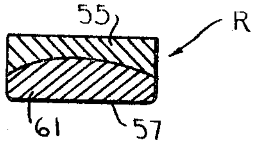

FIG. 14 illustrates the alternative form of pellet to an enlarged scale and inverted as used for soldering.

Corresponding reference characters indicate corresponding parts throughout the several views of the drawings. In view of the small sizes involved, the drawings are to be considered as enlarged and not to exact dimensional scale.

Difficult problems arise in the fabrication and handling of very small conductive pins and pellets which are used in various ways in assembling modular circuit boards and the like. The reason for this is that such pins and pellets are quite small. For example, a typical cylindrical pin P is shown on an enlarged scale in axial section in FIG. 1. Such a pin P (which is simply a long form of pellet) may have a length L ranging from about 10 to 100 mils and a diameter D ranging from about 20 to 25 mils, with tolerances of about 1 mil. In FIG. 9 is shown an enlarged axial section of a typical short form of the product which is a circular pellet Q, of which the diameter D is greater than the thickness T. In this case the diameter may again be on the order of 20 to 25 mils and the thickness T as small as 10 mils. The term pin is used herein to designate the longer forms of the product and the term pellet for the shorter forms. To avoid circumlocution, hereinafter in certain instances, and particularly in the appended claims, the term pellet is used in a generic sense to designate both the long and short forms of the product.

Figure 1:
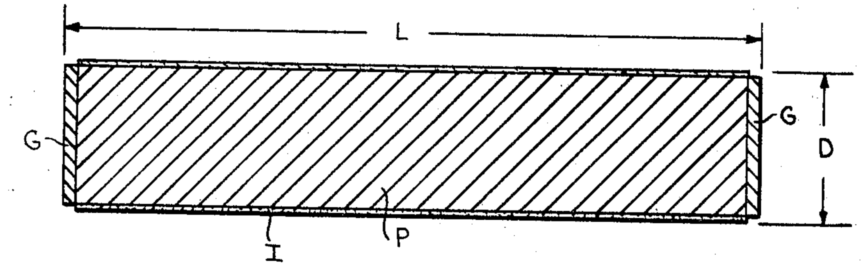
FIG. 1 is an enlarged axial section illustrating a form of conductive pin made according to the invention.
Figure 2:
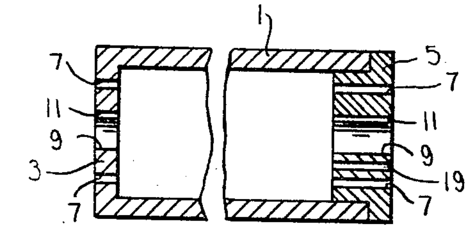
FIG. 2 is a broken axial section taken on line 2—2 of FIG. 3, illustrating an empty mold employed for making articles such as pins or pellets.
Figure 3:
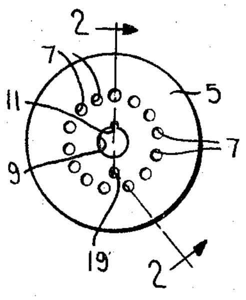
FIG. 3 is a right-end elevation of FIG. 2.
Figure 4:
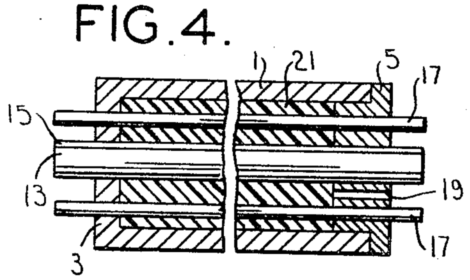
FIG. 4 is a view similar to FIG. 2, showing certain pin- or pellet-forming insertions in the mold, said mold being filled with matrix material.
Figure 8:
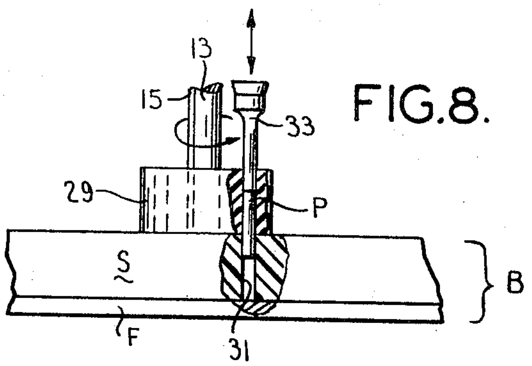
FIG. 8 is a view illustrating a pin-applying step.
Figure 7:
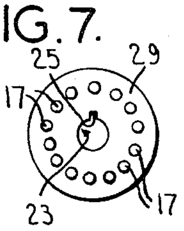
FIG. 7 is a right end elevation of FIG. 6.

The pin form of pellet, such as shown in FIG. 1, is often used for location in one of the holes of an insulating substrate S of a circuit board such as shown at B in FIG. 8. The length of pin P is arbitrary. The pin is used usually for connecting thin conductive foil F with another conductive foil to be applied on the other side of the substrate S after application of the pin P. Sometimes pins such as P are required to pass through openings in foil, from which they should be insulated, in which the pins are to be provided with a surrounding thin skin of insulation such as shown at I in FIG. 1. This insulation may be an insulating organic varnish or an inorganic insulation such as boron nitride. Generally the pins are welded, brazed or soldered at their ends to foil, in which event they are sometimes required to be supplied at their ends with an appropriate metal of a thickness to enhance such welding, brazing or soldering, as illustrated at G in FIG. 1.

Usually shorter pellets such as Q (FIG. 9) require no surrounding insulation but, as will be described below, it is sometimes desirable to have one face provided with a soldering or brazing material for purposes to be made apparent. In any event, whether it is contemplated to employ and emplace the pin form such as shown in FIG. 1, or the short pellet form such as shown in FIG. 9, manufacturing difficulties are encountered because of the small sizes involved. By means of the present invention, these difficulties are mitigated.

Referring now more particularly to FIGS. 2–7, there is shown at numeral 1 a cylindrical cup-shaped mold (preferably made of metal) having a bottom 3 and enclosed by an end cap 5. In each of the bottom 3 and cap 5 is located a group of openings 7. The groups are arranged in identical ring-shaped peripherally disposed patterns such that pairs of holes in each group may be aligned. The bottom 3 and the cap 5 also contain central holes 9, each of which is provided with a keyway 11. When the holes 7 in part 3 and those in the cap 5 are aligned, the holes 9, including their keyways 11, are also aligned.

When the mold is empty, the aligned holes 9 and their keyways 11 are adapted to receive a mandrel 13 having a spline 15 for insertion into the holes and keyways. Also, when the mold is empty, each pair of aligned holes is adapted to receive a rod or wire 17. The rods or wires 17 may or may not carry a thin skin of insulation such as illustrated at I in FIG. 1. After insertion of the mandrel 13 and rods or wires 17, the mold 1 is filled through an opening 19 in the head 5 with a matrix-forming infilling of an epoxy or other suitable resin or the like 21.

Before infilling, any suitable parting compound may be placed on interior surfaces of the mold and its contents. The matrix-forming material is then allowed to set or cure in the mold, so as to become a solid matrix. In this solid form it is impervious to conventional electroplating and metal etching solutions. The cap 5 is then removed and the solid contents removed therefrom. From the resulting matrix 21 is removed the mandrel 13 with the resulting composite shown in FIG. 5. This composite is constituted by the solid matrix 21 with the rods or wires 17 left therein. The matrix has a central opening as shown at 23 i n which is a keyway 25, formed by removal of the splined mandrel 13. In some instances, the mandrel 13 may be left in the matrix 21.

Figure 5:
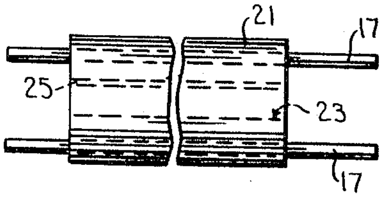
FIG. 5 is a side elevation of a matrix slug obtained from the mold illustrated in FIGS. 2 and 3.
Figure 6:
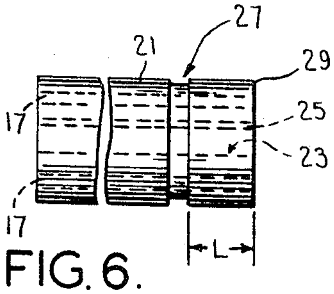
FIG. 6 illustrates certain operations performed upon the matrix slug to form article-supporting discs.

Next, as illustrated in FIG. 6, the wire-containing composite of FIG. 5 is machined flush at both ends, after which it is to be cut off into suitable lengths for pin or pellet formation. This is preferably accomplished by machining on a lathe or the like by cutoff operations. The beginning of a cutoff operation is suggested at numeral 27 on FIG. 6. When the cutoff operation is completed, there results a circular slug-forming matrix of resin wherein a number of peripherally disposed lengths of rod or wire 17 are contained. Each resulting slug is numbered 29. In FIG. 6 a slug 29 is only partially formed. In FIG. 8 it is shown in complete form as cutoff. Each slug (before use as shown in FIG. 8) with its contained pin-forming lengths of rod or wire is placed in a plating bath by means of which the exposed ends of the wires are plated with a suitable conductive material such as gold, silver, tin or the like, for welding, soldering, brazing or the like. This produces an appropriate thickness of the plating, as illustrated for example at G in FIG. 1.

As illustrated in FIG. 8, the resulting pins P may be applied to a circuit board B by inserting the mandrel 13 or a like one in the hole 23 with its spline 15 in keyway 25. If a part of the original mandrel 13 is in the hole 23 it is first pushed out. Then by adjusting the location and angular aspect of the slug 29 through manipulation of the mandrel 13, a pin P may be aligned with an opening such as shown at 31 in the substrate S and the pin forced out by means of a reciprocating tool 33. This places the bottom end of the pin P in contact with the foil F for welding or the like. Ultimately a layer of foil is also applied to the top of substrate S, to which the upper end of the pin P is welded. It will be understood that this is only one application of the invention and that the pins P may be forced from the slugs 29 into openings in other objects or perhaps simply removed from slugs 29 and sent to a storage bin for later use.

In view of the above, it will be seen that the exceedingly small pins P are conveniently manufactured to appropriate lengths, being contained by groups in the slugs 29 for convenient manual or automated application to locations as needed. The pins may or may not have the exterior insulation I.

In order to manufacture shorter forms of pellets according to the invention, such as shown in FIG. 9, without end plating or peripheral insulation, the process as described in reference to FIGS. 2–6 may be employed, except that the insulation I is omttted from the wire or rod, the plating step being also omitted. Cutoff operations such as illustrated at 27 (FIG. 6) are performed to give thinner slugs 29, wherein short pellets such as Q are contained. Such pellets are also even smaller than the pin form and the invention therefore even more useful in manufacturing them.

FIGS. 10 and 11 illustrate the use of the short pellet form Q of FIG. 9. In FIG. 10 there is shown an insulating substrate 35 on which is a highly conductive thin foil pattern 37, composed, for example, of copper, to which a delicate less-conductive lead 39 of a solid-state network is to be welded. For example the lead 39 may be composed of the alloy known as Kovar. FIG. 10 illustrates certain disadvantages when pellets such as Q are not used for so-called parallel electric gap welding. When welding electrodes such as 41 are applied and welding current turned on, as illustrated by the dotted lines 43, much of the current will follow the low-resistance path through the copper foil 37. As a result, there is a tendency for burn-out to occur such as illustrated at the hole 45. This is undesirable and makes it desirable to employ a pellet Q such as illustrated in FIG. 11. In this case the pellet is held on the end of a pellet pusher 47 by suction established through a vacuum passage 49. A slug may be applied to the pusher 47 by inverting the latter and placing a pellet on it while a vacuum is drawn in passage 49. Then the pusher 47 is turned over and brought into position between the electrodes 41, as illustrated in FIG. 11, thereby placing the pellet Q as a shunt on the lead 39 between the electrodes. As a result, a larger cross section of current path is established between the electrodes 41 above the highly conductive thin foil 37. The dotted lines 51 in FIG. 11 illustrate the new shunted current flow, wherein there is a better flux of current near the interface at 53 between the lead 39 and the foil 37, at which point welding occurs efficiently. FIG. 11 illustrates this. Thus by use of a pellet such as shown in FIG. 11, there is a redistribution by shunting of the heating path of the current so as to bring the hottest spot at the welded interface, rather than having such a hot spot disadvantageously located lower in the delicate foil 37, as in FIG. 10. As a result, the burn-out as at hole 45 is avoided (FIG. 11). During welding, the pellet Q may also become welded to the lead 39. In such case it may be left in place without harm.

Another form of the invention is illustrated in FIGS. 12–14. In this case the pellet is lettered R and is characterized by a hard metal backing 55 composed, for example, of nickel. On this is a facing of solder 57. FIGS. 12 and 13 show how the pellet may be made according to the invention. Thus FIG. 12 shows the matrix slug 29 in which the pellet-forming wire 17 (composed, for example, of nickel) has been etched away, as shown by opening 59. This is accomplished by covering one side of the matrix slug 29 with optician's wax, and then immersing it in an etching bath. This etches away part of the contained rods or wires 17, after which solder such as shown at 61 in FIG. 13 is deposited in each opening 59 for attachment to wires 17. Suitable flux may be employed. Before removal of the pellets with their solder from the slugs, any rounded exposed meniscus faces of the solder may be filed, sanded or by other suitable machining operation made substantially flat. After removal from slug 29 of the contained composite pellets 55, 61, there will result a pellet R such as shown in FIG. 14, having a hard backing 55 and a solder face 57.

A pellet such as shown at R in FIG. 14 may be substituted for the pellet Q in the environment shown on FIG. 11. In this case, when the current is turned on, some shunts through the pellet and the solder 57 melts to flow over the lead 39, which solders it to the foil 37. It will be understood in this regard that leads such as 39 are generally narrow, so that the solder can find its way around the lead to effect the soldering connection by capillary flow into the interface between the lead and foil.

In view of the above, it will be seen that by means of the invention, very small pins or pellets having various advantages in the electronics industry may be mass-produced and conveniently applied, either manually or through automation. Not only is cost reduced, but accurately formed pellets having very small tolerances become practically obtainable. A contributing reason is that wire or rods such as 17 may be accurately drawn to small diameters with small tolerances. By machine-slicing them under rotation to lengths while they are located in matrix slugs such as 29, their end faces become accurately formed at right angles to their lengths. This is not true when wires or rods such as 17 are cut to length such as by conventional shearing. By gang-plating or etching the ends of the rods while in slugs such as 29, none of the plating or etching effects appear on the sides of the rods. Therefore, their cylindrical forms are accurately maintained. Moreover, loose individual pins or pellets are not required to be handled. If the sides of the pins are to be insulated, this is economically and accurately accomplished by the use of conventionally accurately insulated wire or rod.

As will be apparent, much better welding, brazing and soldering can be effected at accurately formed pellet ends than if they were irregularly formed at their ends. Moreover, a pellet for use as a shunt for parallel-gap welding as shown in FIG. 11 should have an accurately formed base for contacting a lead such as 39, if consistent current-shunting results are to be obtained.

As to the form of the invention shown in FIGS. 12–14, wherein each pellet has a deposit of solder at one end, the method of manufacture is quite advantageous because of the difficulty of otherwise placing solder on small pellets.

It is to be understood that the use of pellets for welding to avoid the conditions illustrated in FIG. 10 is considered to be new. It is also considered to be new to employ pellets with solder deposits on them for soldering leads by heating with current supplied by electrodes.

It will be understood that the internal shape of the mold 1, and consequently the external shape of the slug 29, may be other than circular around its longitudinal axis. The terms wire and rod as used are to be considered herein to be synonymous.

In view of the above, it will be seen that the several objects of the invention are achieved and other advantageous results attained.

As various changes could be made in the above methods and products without departing from the scope of the invention, it is intended that all matter contained in the above description or shown in the accompanying drawings shall be interpreted as illustrative and not in a limiting sense.

What is claimed is:

1. The method of manufacturing electrically conductive pellets and the like, comprising extending a mandrel through a hollow mold, extending metal rods through the hollow mold in an array peripherally disposed around the mandrel, introducing a moldable material into the mold, said material being adapted to solidify in the mold to form a solid matrix containing the mandrel and the rods, removing the solid matrix from the mold with the mandrel and the rods in the matrix, removing the mandrel from the matrix, segmenting the matrix and contained rods to form slugs containing rod segments of desired lengths and pressing the rod segments from each slug after replacement of the mandrel therein for positioning the slug.

2. The method according to claim 1, wherein said metal rods are peripherally insulated.

3. The method of manufacturing electrically conductive pellets and the like, comprising extending a mandrel through a hollow cylindrical mold, extending metal rods through the hollow mold in a circular array around the mandrel, introducing a moldable material into the mold, said material being adapted to solidify in the mold to form a solid cylindrical matrix containing the mandrel and the rods in lengthwise disposition, removing from the mold the solid matrix with the mandrel and the rods therein, removing the mandrel from the solid matrix, cutting the cylindrical matrix and contained rods crosswise to form disc-like slugs containing peripherally disposed rod segments of desired lengths, inserting a mandrel into each of the disc-like slugs, moving the mandrel to locate the slugs in desired positions and thereafter pressing segments from the slugs at said desired positions.

4. The method according to claim 3, including the step of immersing the slugs in an electroplating bath to electroplate the ends of the pellets before pressing the pellets from the slugs.

5. The method according to claim 4, wherein the metal rods are provided with surrounding insulation before insertion into the mold.

6. The method of manufacturing electrically conductive pellets and the like, comprising extending a mandrel and an array of metal rods through a hollow mold introducing a moldable material into the mold, said material being adapted to solidify in the mold to form a solid matrix containing the mandrel and the rods, removing from the mold the solid matrix with the rods therein, removing the mandrel from the solid matrix, dividing the matrix and contained rods to form slugs containing rod segments of desired lengths, protectively covering the ends of the rod segments on one side of each slug, immersing the slug in an etching bath to etch away portions of the other ends of the slugs therein, depositing and attaching solder on the etched ends of the rod segments, and removing the rod segments including their solder from the slugs to form pellets.

7. The method of manufacturing electrically conductive pellets and the like, comprising extending metal rods through a hollow mold which is elongate on an axis, said rods being parallel to the axis, introducing a moldable material in the mold, said material being adapted to solidify in the mold to form an elongate solid matrix also elongate on the axis and containing the rods, removing from the mold the solid matrix with the rods therein, segmenting the matrix and contained rods by cutting under rotation about the matrix axis to form slugs which contain rod segments of desired lengths and with exposed flat ends, immersing the slugs in an electroplating both to electroplate said ends of the rod segments, and removing the rod segments from the matrix.

References Cited

UNITED STATES PATENTS

| | | | |
|---|---|---|---|
| 3,229,137 | 1/1966 | McCarty | 310—166 X |
| 3,325,881 | 6/1967 | Engelking | 29—411 X |

CHARLIE T. MOON, *Primary Examiner.*

C. E. HALL, *Assistant Examiner.*

U.S. Cl. X.R.

29—412, 529; 264—130, 158, 264